(12) United States Patent
Tauber et al.

(10) Patent No.: US 8,281,485 B2
(45) Date of Patent: Oct. 9, 2012

(54) METHOD OF PRODUCING A CIRCUIT BOARD LAYER

(75) Inventors: Peter Tauber, Tuebingen (DE); Tuncay Sentuerk, Reutlingen (DE); Ulrich Speh, Steinenbronn (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/734,467

(22) PCT Filed: Oct. 13, 2008

(86) PCT No.: PCT/EP2008/063724
§ 371 (c)(1),
(2), (4) Date: Aug. 31, 2010

(87) PCT Pub. No.: WO2009/071363
PCT Pub. Date: Jun. 11, 2009

(65) Prior Publication Data
US 2010/0325881 A1    Dec. 30, 2010

(30) Foreign Application Priority Data

Dec. 3, 2007  (DE) .......................... 10 2007 058 094

(51) Int. Cl.
*H05K 3/36* (2006.01)
(52) U.S. Cl. ................. 29/830; 29/825; 29/846; 29/852
(58) Field of Classification Search ..................... 29/825, 29/830, 846, 852
See application file for complete search history.

(56) References Cited

U.S. PATENT DOCUMENTS

| | | | |
|---|---|---|---|
| 3,956,052 A | | 5/1976 | Koste et al. |
| 4,853,401 A | * | 8/1989 | Bovy et al. .................... 514/389 |
| 5,518,674 A | * | 5/1996 | Powell et al. ................. 264/104 |
| 6,183,588 B1 | * | 2/2001 | Kelly et al. ................... 156/247 |
| 6,235,544 B1 | * | 5/2001 | Franklin et al. ................. 438/14 |
| 6,338,767 B1 | * | 1/2002 | Nakatani et al. .............. 156/233 |
| 6,734,542 B2 | * | 5/2004 | Nakatani et al. .............. 257/687 |
| 6,939,738 B2 | * | 9/2005 | Nakatani et al. .............. 438/108 |

FOREIGN PATENT DOCUMENTS

| | | |
|---|---|---|
| GB | 2 262 661 | 6/1993 |
| JP | 02121392 A  * | 5/1990 |
| JP | 2002/314 227 | 10/2002 |
| JP | 2005/057157 | 3/2005 |

OTHER PUBLICATIONS

Anonymous: "Via Processing Technique for Decal Transfer Technology," IBM Technical Disclosure Bulletin, Bd. 32, Nr. 2, Jul. 1, 1989, pp. 475-476.

* cited by examiner

*Primary Examiner* — Carl Arbes
(74) *Attorney, Agent, or Firm* — Kenyon & Kenyon LLP

(57) ABSTRACT

A method for producing a circuit board layer, in particular for a multilayer circuit board, a ceramic foil upon which a carrier foil is disposed being used, the carrier foil being perforated by laser to form at least one circuit trace, and/or the carrier foil and the ceramic foil being perforated together by laser to form at least one feedthrough, the circuit trace and/or the feedthrough subsequently being created by printing, the carrier foil constituting a printing screen, and the carrier foil subsequently being removed from the ceramic foil.

15 Claims, 2 Drawing Sheets

METHOD OF PRODUCING A CIRCUIT BOARD LAYER

BACKGROUND OF THE INVENTION

1. Field of the Invention

The present invention relates to a method for producing a circuit board layer (circuit level), for an in particular multilayer circuit board, a ceramic foil having a carrier foil disposed on it being used.

2. Description of Related Art

The constantly progressing miniaturization and continuously increasing complexity of electronic circuits require the production and use of multilayer circuits, that is, circuits in which circuit components are disposed on a plurality of levels and are combined into one functional unit. In the related art, ceramic multilayer circuits are known for this purpose, which are made up of flexible, ceramic, so-called blank foils, which are made up of organic binding agents, solvents, and inorganic components. Two process stages may be roughly distinguished in the current process flow for producing the multilayer circuit in the multilayer ceramic design, that is, the co-fire process and the post-fire process, the co-fire process describing the processing in the blank state and the post-fire process describing the processing in the ceramic state. In the first process stage, the co-fire process, the process sequence common in the related art is designed such that the ceramic blank foils are mounted on a carrier medium, and a patterning of the circuit is performed by stamping the blank foils, that is, a mechanical process step, as a function of the design of the circuit for the product in which the circuit is to be used. In particular, the individual circuit paths, that is, circuit traces, for example, are created in this process. Then, feedthroughs, so-called vias, are printed with the aid of a pattern representing one of these vias or with the aid of such a screen, which means that the holes stamped as vias are filled with electrically conductive thick-film paste with the aid of a screen-printing technique. Then, the blank foil on which vias are printed is dried. Subsequently, circuit traces are printed on the blank foil with the aid of an additional, different pattern; the pattern used in this instance renders the print image of the circuit traces. Subsequently, the blank foil on which vias and circuit traces are now printed is dried again. In the next processing step, a plurality of blank foils produced in this manner are stacked and laminated, which results in the laminate of the multilayer circuit. Subsequently, the blank foils or the laminate are sintered as a whole, and this results in the ceramic multilayer circuit. This requires a plurality of process steps, which in particular are highly susceptible to dimensional discrepancies and positional discrepancies between individual method steps, for example, of the printing processes with regard to the feedthroughs (vias) and the circuit traces, in which extremely high dimensional accuracy requirements must be satisfied. Another disadvantage of this process is that a plurality of differently designed or equipped machines must be used for different processing steps in the mass production; moreover, a high occupation of buffer spaces for drying and intermediate storage periods, for example, is a disadvantage. It is also a disadvantage that in particular after the stamping and printing processes respectively a quality control has to take place in order to be able to satisfy the required dimensional accuracies. The circuit trace spacings and via diameters cannot be miniaturized at will using the process technology known in the related art; at present, there are limitations with regard to this miniaturization of approximately 80 µm for via diameters and of approximately 130 µm for the circuit trace width. This prevents an even more compact design of the multilayer circuits.

SUMMARY OF THE INVENTION

It is an object of the present invention to provide a method for producing ceramic multilayer circuits that avoids the mentioned disadvantages and advantageously allows for the effective and inexpensive production of circuit board layers, namely ceramic circuit levels, of the generic type, with a very high precision.

To this end, a method for producing a circuit board layer for an in particular multilayer circuit board is provided, a ceramic foil upon which a carrier foil is disposed being used, the carrier foil being perforated by laser to form at least one circuit trace, and/or the carrier foil and the ceramic foil being perforated together by laser to form at least one feedthrough, the circuit trace and/or the feedthrough subsequently being created by printing, the carrier foil constituting a printing screen, and the carrier foil subsequently being removed from the ceramic foil. In this context, ceramic foil is understood to mean a ceramic blank foil known from the related art, for example. It features a carrier medium, namely the carrier foil. It is perforated by applying a laser, or carrier foil and ceramic foil are perforated together to form feedthroughs. This method step replaces the stamping in the methods known in the related art. Subsequently, the circuit trace and/or the feedthrough are created, namely by printing with electrically conductive thick-film paste. With regard to its rheological properties, this is to be selected or formulated to the effect that it must satisfy both the requirements for filling the vias (feedthroughs) and those of the planar circuit trace print. Moreover, it must feature special sintering properties in accordance with the paste for feedthroughs known from the related art. When printing the circuit traces and/or feedthroughs, which are produced in this manner, the carrier foil acts as a printing screen. Unlike in the related art, no separate pattern that is a function of the circuit layout and that has corresponding requirements for dimensional accuracy and accuracy of fit is placed on the ceramic foil and used as a printing screen for the printing, but rather the carrier foil itself, which due to the lasering has cut-outs down to the ceramic foil or cut-outs straight through the ceramic foil, acts as a printing screen in its fixed state, mounted on the ceramic foil. The printing screen is produced quasi by the lasering itself; the printing screen is quasi a single-use printing screen, which is only used to print precisely the ceramic foil on which it was originally mounted. Thus, all tolerance, dimensional accuracy, and accuracy of fit problems that are known from the related art are eliminated. In particular, in this instance, it is also possible to achieve a higher degree of miniaturization with regard to the feedthroughs and the circuit traces. Additionally, only a kind of universal pattern is required, which is used exclusively for transporting the paste, however. It has no patterns that correspond to the circuit layout. After the printing, the carrier foil is removed, which means that the circuit board layer (circuit level) is in the completed stage at the end of the co-fire process and is ready for laminating with other circuit board layers.

In an additional development of the method, the carrier foil is removed with the aid of an adhesive substrate bonded to the carrier foil, in particular, adhesive foil, which subsequently is removed again along with the carrier foil. In the related art, it is common to pull the carrier foil off laterally prior to stacking/laminating by grasping one of its corners. This is not possible in laser-patterned carrier foils of the type according to the present invention, which is why a second adhesive foil, or another suitable carrier substrate, is bonded to the laser-patterned carrier foil, which has the cut-outs from lasering, and is subsequently removed again along with the carrier foil. The laser-patterned/perforated carrier foil thus remains bonded to the adhesive foil and is removed along with it from the printed ceramic foil. In particular, an additional carrier foil as known from the related art may be used as the adhesive foil. This has the advantage of being available in large quantities in the production plant.

In an additional development of the method, the circuit board layer is connected to at least one additional circuit board layer. A plurality of circuit board layers are accordingly stacked into a multi-layer circuit and laminated.

Ultimately, the circuit board made up of a plurality of circuit board layers, that is, the multi-layer circuit, is sintered, thus adding the last method step of the co-fire process. During sintering, the existing ceramic foils and circuit traces and feedthroughs solidify into the multilayer circuit.

Advantages of the method according to the present invention are in particular that no layout-dependent and level-dependent tools are required for stamping, as required in the related art, since a single laser, for example, a $CO_2$ laser can perform all method steps in which perforations of the carrier foil and/or ceramic foil are produced; only the power of laser is varied in accordance with the burn-in depth, it thus is adjusted to be stronger, that is, to a higher power, for the production of feedthroughs (vias), or will be applied to the corresponding part longer than is the case during the production of circuit traces. In contrast to the related art, the printing takes place in a simultaneous printing method, that is, feedthroughs and circuit traces are produced in one procedure. In this instance as well, no layout-dependent or level-dependent tools are required for the printing of feedthroughs and/or circuit traces. Furthermore, no separate printers are required for printing the feedthroughs and circuit traces, since the printing may be performed by one single machine. A largely tool-free production and a reduction in the occupation of buffer spaces, for example by eliminating drying steps after the printing of feedthroughs and using only one paste for feedthroughs and circuit traces, results in a significant reduction of clean room area, storage areas, and expendable supplies. The elimination of separate printing, and of set-up times for each level and for each layout in the production of stampings common in the related art, in the printing of feedthroughs and during printing of circuit traces, reduces the processing times and the number of processes; furthermore, the process check, in particular; the quality control, is significantly simplified and made leaner.

DETAILED DESCRIPTION OF THE INVENTION

Figure 1:
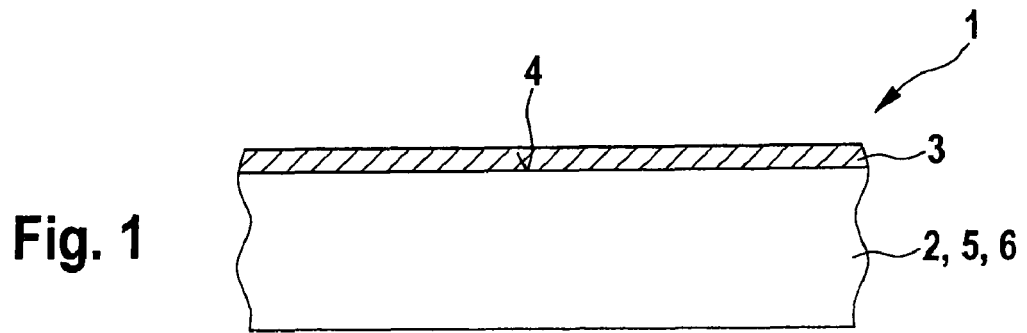
FIGS. 1-7 show individual method steps of the production of a circuit board layer (circuit level) for an in particular multilayer circuit board (ceramic substrate).

FIG. 1 shows raw material 1 for producing a circuit board layer, namely a ceramic foil 2 having a carrier foil 3 disposed on it. The entire surface of the carrier foil is bonded to an upper side 4 of ceramic foil 2. Ceramic foil 2 is a blank foil 5, in particular, a flexible ceramic blank foil 6.

Figure 2:
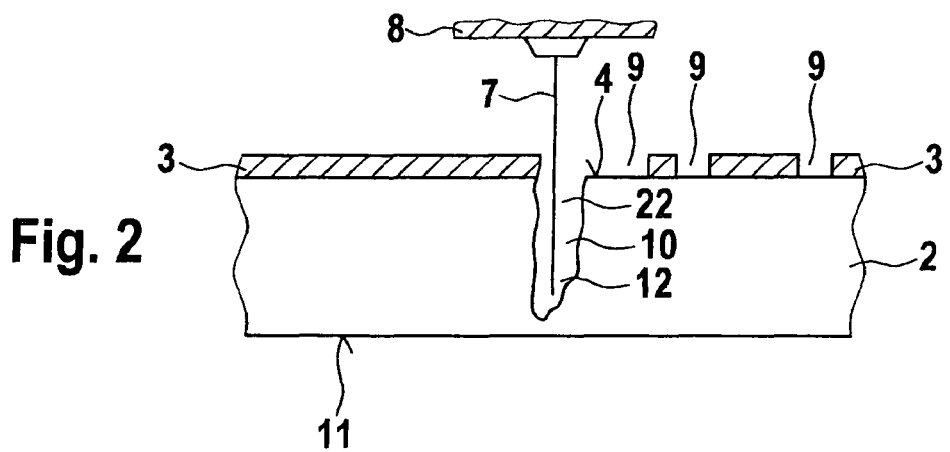

FIG. 2 shows applying a laser beam 7 to raw material 1, which laser beam 7 is guided by a laser device 8 across raw material 1 as a function of the desired layout of the circuit board layer to be produced. Laser beam 7 perforates carrier foil 3 in perforation areas 9 by applying energy, so that carrier foil 3 is removed down to upper side 4 of ceramic foil 2. Consequently, upper side 4 of ceramic foil 2 is exposed after this perforation by laser beam 7. Laser beam 7 may furthermore be set, for example by increasing its laser power, to perforate ceramic foil 2, namely to produce vias 22 for feedthroughs 10; in this case, the laser power is measured or the dwell time of laser beam 7 is set such that not only carrier foil 3 but also ceramic foil 2 is perforated. The perforating of ceramic foil 2 to produce feedthrough 10 is continued until ceramic foil 2 is completely perforated at the place where feedthrough 10 is to be formed, that is, from upper side 4 to underside 11, and thus a continuous feedthrough perforation 12, namely via 22, forms.

Figure 3:
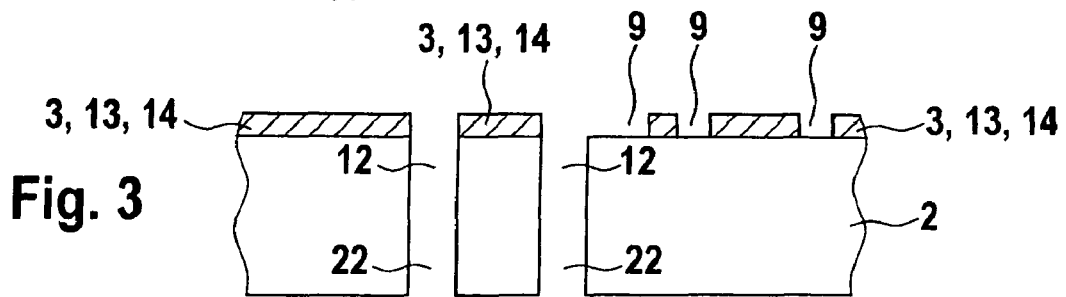

FIG. 3 illustrates ceramic foil 2 after the production of feedthrough holes 12 (vias 22) and perforation regions 9 and supported carrier foil 3. Carrier foil 3 is removed both in perforation regions 9 and in particular also in feedthrough holes 12; additionally, all material parts of ceramic foil 2 originally situated in feedthrough holes 12 are also removed; feedthrough holes 12 thus penetrate ceramic foil 2 and carrier foil 3 completely when the vias are formed. With its remaining carrier foil parts 13, carrier foil 3 forms a printing screen 14. For it covers regions of upper side 4 of ceramic foil 2 that are not to be printed, and exposes perforation regions 9 and feedthrough holes 12 for printing. The use of a separate printing screen that has to be mounted in a manner adjusted to fit exactly the desired layout of the circuit board layer to be produced thus becomes redundant.

Figure 4:
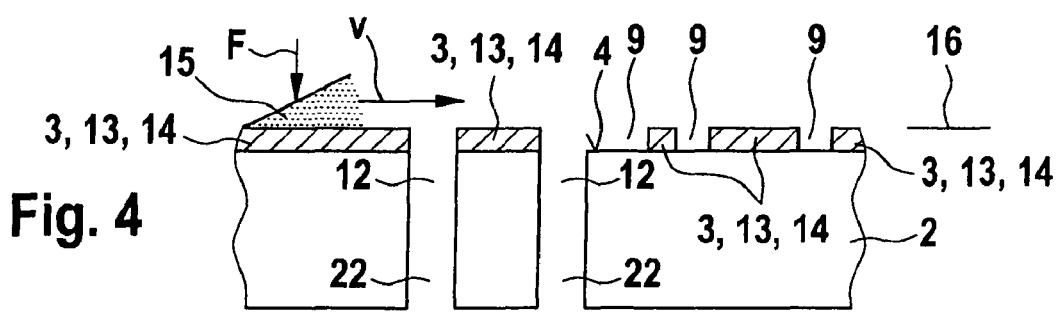

FIG. 4 shows the depositing of electrically conductive printing paste 15 on printing screen 14, which is formed from carrier foil parts 13, to produce the printed circuit on ceramic foil 2 in accordance with its layout. The printing paste is deposited on printing screen 14 at a print speed v by applying a depositing force F essentially in a level 16 parallel to upper side 4 of ceramic foil 2. With regard to its rheological properties, printing paste 15 is selected or adjusted such that it can fill completely and uniformly both feedthrough holes 12 (vias 22) and perforation regions 9 in the course of the printing process.

Figure 5:
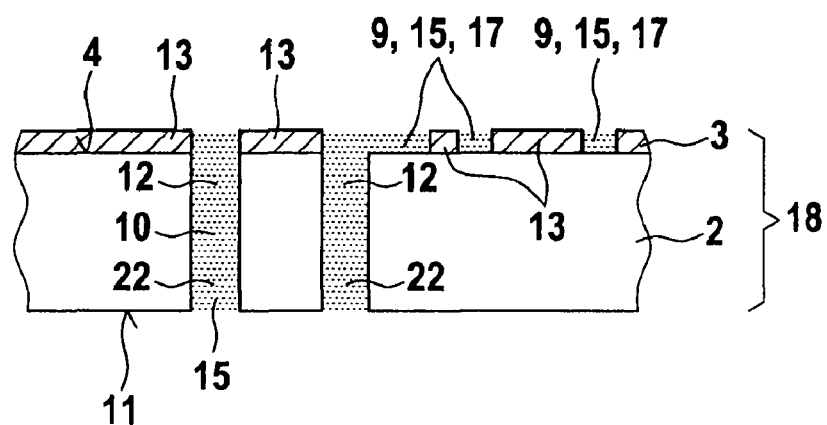

FIG. 5 shows ceramic foil 2 after printing. The regions of upper side 4 of carrier foil 2 that are not covered by carrier foil parts 13, and feedthrough holes 12 (vias 22) are thus filled with printing paste 15. In the process, printing paste 15 forms feedthroughs 10 in the region of feedthrough holes 12, namely the connection of upper side 4 and underside 11 of ceramic foil 2. In perforation regions 9, that is, where only carrier foil 3 was perforated, but not ceramic foil 2, printing paste 15 is inserted between the remaining carrier foil parts 13 on upper side 4 of ceramic foil 2. In this manner, circuit traces 17 form on upper side 4 of ceramic foil 2 and between carrier foil parts 13. Circuit traces 17 and feedthroughs 10 are connected to each other to form the layout of the desired circuit trace on ceramic foil 2 as needed, and together form a circuit board layer 18.

Figure 6:
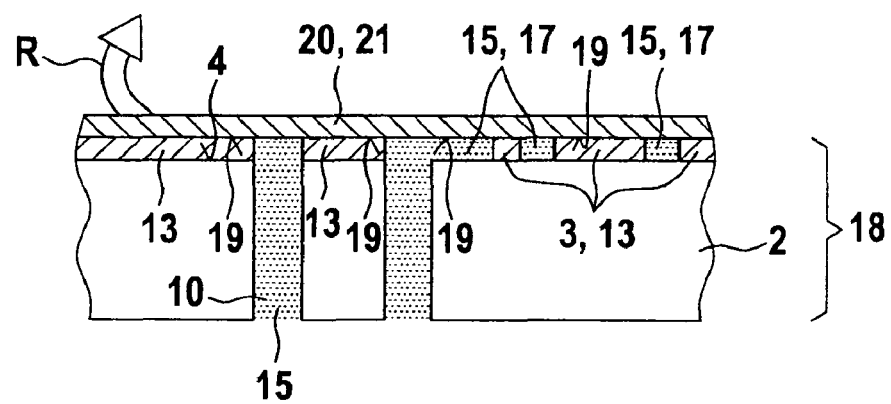

FIG. 6 shows circuit board layer 18 obtained in this manner with the remaining carrier foil parts 13 that are to be removed. To remove these carrier foil parts 13, an adhesive substrate 20 is applied on circuit board layer 18, namely on a carrier foil upper side 19, which bonds with carrier foil parts 13. In particular, an adhesive foil 21 may be used as adhesive substrate 20, even in the form of a carrier foil 3 known from the previous process steps, for example. After the bonding of adhesive substrate 20 to carrier foil parts 13, which results in a connection as intimate as possible between adhesive substrate 20 and carrier foil parts 13, adhesive substrate 20 is pulled off of circuit board layer 18, for example, in the direction of arrow R. Carrier foil parts 13 adhering to adhesive substrate 20 are also removed in the process from upper side 4 of ceramic foil 2 and from feedthroughs 10 and circuit traces 17. In this manner, carrier foil parts 13, which are not desired in the further processing of circuit board layer 18, may be completely removed from circuit board layer 18 in one procedure.

Figure 7:
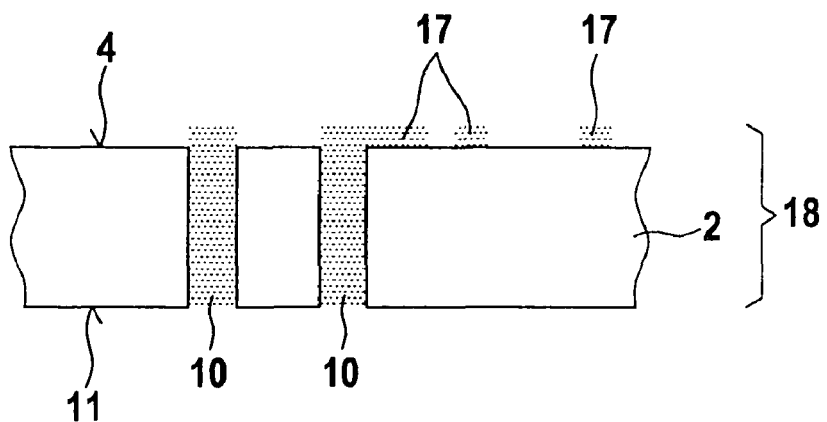

FIG. 7 shows circuit board layer 18 obtained in this manner in the state after the removal of carrier foil parts 13. Ceramic foil 2 remains, which is provided with feedthroughs 10 between upper side 4 and under side 11, and which has circuit traces 17.

Circuit board layer 18 obtained in this manner may be laminated with additional circuit board layers 18 in subsequent method steps, in particular with ones having another layout, and may then be connected by sintering to form a ceramic multilayer circuit.

What is claimed is:

1. A method for producing a circuit board layer for a multilayer circuit board, comprising:
    perforating a carrier foil which is disposed upon a ceramic foil using a laser to form at least one circuit trace, or perforating the carrier foil and the ceramic foil together by laser to form at least one feedthrough, the circuit trace or the feedthrough subsequently being created by printing, wherein the carrier foil constitutes a printing screen, and
    subsequently removing the carrier foil from the ceramic foil.

2. The method as recited in claim 1, wherein the carrier foil is removed with the aid of an adhesive substrate bonded onto the carrier foil, which subsequently is pulled off again along with the carrier foil.

3. The method as recited in claim 2, wherein the adhesive substrate is adhesive foil.

4. The method as recited in claim 1, wherein the circuit board layer is connected to at least one additional circuit board layer.

5. The method as recited in claim 2, wherein the circuit board layer is connected to at least one additional circuit board layer.

6. The method as recited in claim 1, wherein a circuit board made up of a plurality of circuit board layers is produced and is sintered.

7. The method as recited in claim 2, wherein a circuit board made up of a plurality of circuit board layers is produced and is sintered.

8. The method as recited in claim 4, wherein a circuit board made up of a plurality of circuit board layers is produced and is sintered.

9. The method as recited in claim 1, wherein a feedthrough having a diameter of less than 80 µm is produced.

10. The method as recited in claim 9, wherein a feedthrough having a diameter of less than 75 µm is produced.

11. The method as recited in claim 1, wherein a circuit trace having a circuit trace width of less than 130 µm is produced.

12. The method as recited in claim 1, wherein a circuit trace having a circuit trace width of less than 100 µm is produced.

13. The method as recited in claim 1, wherein the ceramic foil is a flexible ceramic blank foil.

14. The method as recited in claim 2, wherein the carrier foil is completely removed.

15. The method as recited in claim 14, wherein the carrier foil is completely removed in a single procedure.

\* \* \* \* \*